United States Patent
Malik et al.

(10) Patent No.: US 9,123,856 B2
(45) Date of Patent: Sep. 1, 2015

(54) AFFECTING THE THERMOELECTRIC FIGURE OF MERIT (ZT) AND THE POWER FACTOR BY HIGH PRESSURE, HIGH TEMPERATURE SINTERING

(75) Inventors: Abds-Sami Malik, Westerville, OH (US); Francis J. DiSalvo, Ithaca, NY (US); Yongkwan Dong, Tampa, FL (US)

(73) Assignee: Diamond Innovations, Inc., Worthington, OH (US)

( * ) Notice: Subject to any disclaimer, the term of this patent is extended or adjusted under 35 U.S.C. 154(b) by 50 days.

(21) Appl. No.: 13/583,993

(22) PCT Filed: Mar. 11, 2010

(86) PCT No.: PCT/US2010/026979
§ 371 (c)(1),
(2), (4) Date: Sep. 11, 2012

(87) PCT Pub. No.: WO2011/112194
PCT Pub. Date: Sep. 15, 2011

(65) Prior Publication Data
US 2013/0001480 A1    Jan. 3, 2013

Related U.S. Application Data

(63) Continuation-in-part of application No. 13/376,428, filed as application No. PCT/US2010/026979 on Mar. 11, 2010.

(51) Int. Cl.
| | | |
|---|---|---|
| *H01L 35/16* | (2006.01) | |
| *H01L 35/34* | (2006.01) | |
| *B01J 3/06* | (2006.01) | |
| *B22F 9/04* | (2006.01) | |
| *B22F 3/14* | (2006.01) | |
| *C01B 19/00* | (2006.01) | |
| *C01G 19/00* | (2006.01) | |
| *C01G 21/00* | (2006.01) | |
| *C01G 21/21* | (2006.01) | |
| *C22C 1/04* | (2006.01) | |

(52) U.S. Cl.
CPC . *H01L 35/16* (2013.01); *B22F 3/14* (2013.01); *C01B 19/002* (2013.01); *C01B 19/007* (2013.01); *C01G 19/00* (2013.01); *C01G 19/006* (2013.01); *C01G 21/006* (2013.01); *C01G 21/21* (2013.01); *C22C 1/04* (2013.01); *H01L 35/34* (2013.01); *B22F 2998/10* (2013.01); *C01P 2002/72* (2013.01); *C01P 2004/03* (2013.01); *C01P 2004/04* (2013.01); *C01P 2006/40* (2013.01)

(58) Field of Classification Search
USPC ........... 252/62.3 T; 136/236.1–241; 438/102, 438/799, 795
See application file for complete search history.

(56) References Cited

U.S. PATENT DOCUMENTS

| | | | |
|---|---|---|---|
| 2,941,241 A | 6/1960 | Strong | |
| 2,941,248 A | 6/1960 | Hall | |
| 3,030,662 A | 4/1962 | Strong | |
| 3,609,818 A | 10/1971 | Wentorf, Jr. | |
| 3,695,867 A * | 10/1972 | Skrabek et al. | 420/556 |
| 3,767,371 A | 10/1973 | Wentorf, Jr. et al. | |
| 4,289,503 A | 9/1981 | Corrigan | |
| 4,673,414 A | 6/1987 | Lavens et al. | |
| 4,954,139 A | 9/1990 | Cerutti | |
| 6,833,083 B2 * | 12/2004 | Imai et al. | 252/62.3 T |
| 8,394,729 B2 * | 3/2013 | Malik | 438/797 |
| 2006/0053969 A1 * | 3/2006 | Harada et al. | 75/255 |

FOREIGN PATENT DOCUMENTS

| | | |
|---|---|---|
| EP | 2255906 | 12/2010 |
| JP | 2002353527 | 6/2002 |
| WO | 2008002910 | 1/2008 |
| WO | WO 2008/002910 * | 1/2008 |
| WO | 2010080153 | 7/2010 |

OTHER PUBLICATIONS

Zhu, Pin-Wen et al. "PbTe Synthesis by High Pressure and High Temperature Approach"; Chinese Journal of High Physics, vol. 16, No. 3, Sep. 2002, pp. 1-6.

Su, T. et al. "Electric transport and thermoelectric properties of PbTe doped with Sb2Te3 prepared by high-pressure and high-temperature", Journal of Alloys and Compounds, Elsevier Sequioa, Lausanne, CH, vol. 422, No. 1-2 (Sep. 28, 2006), pp. 328-331.

Snyder, G.J. and Toberer, E.S., "Complex thermoelectric materials", Nature Materials, 2008, 7: p. 105-114.

Schennikov V. et al.: "Thermopower of lead chalcogenides at high pressures", Physics of the Solid State, Nauka/Interperiodica, MO., vol. 44, No. 10, Oct. 1, 2002, pp. 1845-1849.

Polvani D A et al., "Large improvement in thermoelectric properties in pressure-tuned p-type Sb1.5 BioTe3", Database accession No. 7532638; & Chemistry of Materials American Chem. Soc. USA, vol. 13, No. 6, 2068-2071.

Meng JF et al: "Multifold enhancement of the thermoelectric figure of merit in p-type BaBiTe3 by pressure tuning," Journal of Applied Physics, American Institute of Physics, New York, US, vol. 90. No. 6, Sep. 15, 2001, 2836-2839.

Zhu, Pinwen et al.: "Electrical Transport and Thermoelectric Properties of PbTe Prepared by HPHT", Materials Transactions, vol. 45, No. 11 (2004) pp. 3102-3105.

(Continued)

*Primary Examiner* — Carol M Koslow
(74) *Attorney, Agent, or Firm* — Keith G. DeMaggio

(57) ABSTRACT

A method for increasing the ZT of a material, involves creating a reaction cell including a material in a pressure-transmitting medium, exposing the reaction cell to elevated pressure and elevated temperature for a time sufficient to increase the ZT of the material, and recovering the material with an increased ZT.

9 Claims, 15 Drawing Sheets

(56) References Cited

OTHER PUBLICATIONS

Su, T., Jia, X, Ma, H., Zhou, L., Guo J.,Dong,N. (2007) "Enhanced power factor of Ag0.208Sb0.275Te0.517 prepared by HPHT", Physics Letters A 372 (2008) 515-518.

Su, T., Jia, X, Ma, H., Zhou, L., Guo J. (2007) "Preparation and transport properties of AgSvTe2 by high-pressure and high-temperature", Journal of Alloys and Compounds, Elsevier Sequoia, Lausanne, CH, vol. 454 (2008) 415-418.

Hsu, K.F. Loo, S. Guo, F., Chen, W., Dyck, J.,Uher, C., Hogan,T. Polychroniadis, E.K., Kanatzidis, M. "Cubic AgPbmSbTe2+m: Bulk thermoelectric materials with high figure of merit", Science vol. 303, (2004) 818-821.

Zhu, P.W., et al. "A new method of synthesis for thermoelectric materials: HPHT" Solid State Commuications, Oxford, vol. 123, Jan. 1, 2002, pp. 43-47.

Ovsyannikov S, et al. "Pressure-tuned colossal improvement of thermoelectric effiecient of PbTe" Applied Physics Letters, AIP, American Institute of Physics, Melville, NY, US, vol. 90, No. 12, Mar. 19, 2007, pp. 122103-1222103.

Su. T. et al., "Thermoelectric properties of nonstoichoimetric PbTe prepared by HPHT", Journal of Alloys and Compounds, Elsevier Sequoia, Lausanne, CH, vol. 468, No. 1-2, Jan. 22, 2009m pp. 410-413.

Kishimoto et al. Preparation of sintered degenerate n-type PbTe with a small grain size and its thermoelectric properties:, Journal of Applied Physics, Sep. 1, 2002, 2544-2549, vol. 92, No. 5. American Institute of Physics.

Taichao Su et al: "Enhanced thermoelectric performance of AgSbTe2 synthesized by high pressure and high temperature", Journal of Applied Physics, New York, US, vol. 105, No. 7, Jun. 15, 2009 (pp. 073713-1-073713-4), XP002572319.

Zhu P W et al: "Giant improved thermoelectric properties in PbTe by HPHT at room temperature", Chemical Physics Letters, North-Holland, Amersterdam, NL, vol. 359, Jan. 1, 2002, pp. 89-94, XP002476728.

Dong Y et al: "Transport properties of undoped and Br-doped PbTe sintered at high-temperature and pressure >=4.0 GPa" Journal of Solid State Chemistry, Orlando, FL, US, vol. 182, No. 10, Oct. 1, 2009, pp. 2602-2607, XP026670728.

Su et al: "Enhanced power factor of Ag0.208Sb0.275Te0.517 prepared by HPHT", Physics Letters A, North-Holland Publishing Co., Amsterdam, NL, vol. 372, No. 4, Jan. 4, 2008, pp. 515-518, XP022409555.

Ma et al: "Preparation and transport properties of AgSbTe2 by high-pressure and high-temperature", Journal of Alloys and Compounds, Elsevier Sequoia, Lausanne, CH, vol. 454, No. 1-2, Mar. 18, 2008, pp. 415-418, XP022540599.

Snyder, G. Jeffrey et al., "Complex thermoelectric materials", Nature Materials, Nature Publishing Group, New York, NY, US, vol. 7, No. 2, Feb. 2008, pp. 105-114.

McGuire, Michael A. et al., "Effects of high-pressure and high-temperature treatment on the thermoelectric properties of PbTe", Journal of Alloys and Compounds, Elsevier B.V., available online May 25, 2007.

\* cited by examiner

| Sample labels | Pressure (GPa) | Temp. (°C) | power factor ($\times 10^{-3}$ W m$^{-1}$ K$^{-2}$) | Rhombohedral angle |
|---|---|---|---|---|
| A | 4.0 | 550 | 2.81 | 89.17 |
| B | 4.0 | 650 | 3.25 | 89.14 |
| C | 4.0 | 750 | 3.85 | 89.12 |
| D | 4.0 | 800 | 4.32 | 89.12 |
| E | 4.0 | 850 | 3.71 | -- |
| F | 3.5 | 750 | 3.14 | 89.12 |
| G | 4.5 | 750 | -- | 89.16 |
| H | 4.5 | 850 | -- | -- |
| I | 3.5 | 800 | -- | -- |

Figure 5

| Sample | In (× 10¹⁹/cm³) | Sintering Temp. (°C) | 400 °C, 10d | S (μV/K) | κ (mW/cm K) | σ (S/cm) | ZT |
|---|---|---|---|---|---|---|---|
| A | 1.0 | 800 | N | 110.92 | 17.11 | 763.36 | 0.165 |
| B | 2.0 | 800 | N | 128.62 | 12.69 | 662.25 | 0.259 |
| C | 1.0 | 900 | N | 117.42 | 17.23 | 609.76 | 0.146 |
| D | 2.0 | 900 | N | 132.25 | 15.25 | 671.14 | 0.231 |
| E | 3.0 | 900 | N | 143.64 | 12.91 | 364.96 | 0.175 |
| G | 2.0 | 925 | N | 122 | 15.1 | 826 | 0.24 |
| H | 2.0 | 950 | N | 136 | 13.7 | 685 | 0.28 |
| A1 | 1.0 | 800 | Y | 50.66 | 21.66 | 558.66 | 0.020 |
| B1 | 2.0 | 800 | Y | 55.41 | 21.80 | 1727.12 | 0.073 |
| C1 | 1.0 | 900 | Y | 117.96 | 16.22 | 757.58 | 0.195 |
| D1 | 2.0 | 900 | Y | 63.59 | 20.15 | 1811.59 | 0.109 |
| E1 | 3.0 | 900 | Y | 120.80 | 14.75 | 735.29 | 0.218 |
| F1 | 2.0 | 900 | Y | 53 | 20.6 | 1928 | 0.08 |
| G1 | 2.0 | 925 | Y | 74 | 19.0 | 1761 | 0.15 |
| H1 | 2.0 | 950 | Y | 64 | 18.7 | 1422 | 0.09 |

AFFECTING THE THERMOELECTRIC FIGURE OF MERIT (ZT) AND THE POWER FACTOR BY HIGH PRESSURE, HIGH TEMPERATURE SINTERING

CROSS-REFERENCE TO RELATED APPLICATIONS

This application is a §371 National Stage Application of PCT international Application No. PCT/US2010/026979 filed Mar. 11 2010 and a continuation in part of application Ser. No. 13/376,428 filed Dec. 6, 2010.

STATEMENT REGARDING FEDERAL SPONSORED RESEARCH

Not applicable.

JOINT RESEARCH AGREEMENT

Research was carried out in collaboration with Cornell University funded by Diamond Innovations, Inc.

INCORPORATION BY REFERENCE OF MATERIAL ON DISC

Not applicable.

BACKGROUND

The Seebeck effect, or the thermoelectric effect, is the voltage difference that exists between two points of a material when a temperature gradient is established between those points. Materials, usually semiconductors or conductors, which exhibit this phenomenon, are known as thermoelectrics or thermoelectric materials. Devices made from thermoelectric materials take advantage of the Seebeck effect to convert heat into electricity. For instance, the Seebeck effect is the physical basis for a thermocouple, which is often used in temperature measurement.

Measurements of the Seebeck effect are reported as the Seebeck coefficient (S) in units of $\mu V/K$ (microvolts per Kelvin). The Seebeck coefficient can be defined as the ratio between the open circuit voltage and the temperature difference, between two points on a conductor, when a temperature difference exists between those points. The Seebeck coefficient can take either positive or negative values depending upon whether the charge carriers are holes or electrons respectively.

The efficiency of thermoelectric materials is a monotonically increasing function of the figure-of-merit, $Z = S^2 \sigma/\kappa$, where $\sigma$ (in units of $\Omega^{-1} cm^{-1}$) is the electrical conductivity, and $\kappa$ (in units of W/cm K) is the thermal conductivity. In determining device efficiency, Z times the temperature (ZT) is a useful metric and is dimensionless. A material needs a large absolute S to maximize ZT, while electrical resistivity and thermal conductivity should be low. A high electrical conductivity results in minimizing Joule heating in the thermoelectric material, while a low thermal conductivity helps to maintain large temperature gradients in the material. Another useful metric is the power factor which is simply the square of the thermopower times the electrical conductivity.

Metals and metal alloys received much interest in the early development of thermoelectric applications, but these materials have a high thermal conductivity. Furthermore, the Seebeck coefficient of most metals is on the order of 10 $\mu V/K$, or less. Depending upon the doping level semiconducting materials can attain Seebeck coefficients greater than 100 $\mu V/K$. Generally, semiconductors can also possess moderately high electrical conductivity and low thermal conductivity, which further increases Z, and thus the efficiency of the thermoelectric material. For instance, bismuth telluride ($Bi_2Te_3$) and lead telluride (PbTe) are two commonly used semiconductor thermoelectric materials with optimized ZT close to 1. Bismuth telluride's optimal operating temperature is around 300 K and PbTe is around 700 K. Optimized materials are complex alloy compositions, such as $Sb_{1.6}Bi_{0.4}Te$, $Bi_2Te_{2.4}Se_{0.6}$, or $Pb_{0.6}Sn_{0.4}Te$, with various dopants to control thermal conductivity and carrier concentration. No commercially available materials exist with ZT substantially greater than 1. As shown in FIG. 1, no commercial materials exist with ZT of 1.5 or greater. A material possessing higher ZT is more efficient and a ZT of ~4 would be required to approach the thermodynamic efficiencies obtained by conventional internal combustion engines.

As mentioned above, optimizing the ZT of a material generally involves synthetic methods by which the stoichiometry of the starting material is altered by doping and/or by alloying with aliovalent elements. Dopants are generally intended to increase the electrical conductivity of the material, while alloying is intended to reduce the thermal conductivity and modify the band gap. Often, this leads to a material with an entirely different composition from the parent compound. However, in many materials dopants are not electrically active, due to the presence of compensating defects that are induced or modified by doping. Consequently, there is no easy way to predict the Seebeck coefficient of the resulting material composition, which can be diminished due to doping and alloying.

SUMMARY

A method of increasing the ZT and/or power factor of a thermoelectric material includes exposing it to elevated pressure (sintering pressure) and elevated temperature (sintering temperature) for a time sufficient to sinter the material and increase the ZT and/or power factor of the material, when measured at the pressure of use (i.e. ambient pressure), and recovering the material. The enhanced ZT and/or power factor may persist when the material is kept at the use temperature and pressure for extended periods of time ranging from days to months or years.

In embodiments, the elevated pressure may range from about 1 GPa to about 20 GPa and the elevated temperature may range from about the sintering temperature to about 500° C. above the melting point of the material at process pressures, for example, about 500° C. to about 2500° C. In still other embodiments the pressure may range from about 2 GPa to about 10 GPa. In still other embodiments, the pressure may range from about 4 GPa to about 8 GPa, and preferably about 4 GPa.

In exemplary embodiments, sintering may be accomplished in a temperature range from about the sintering temperature to about 500° C. above the melting point of the material at process pressures. In other embodiments, the temperature may range from about 900° C. to about the melting point of the material at the process pressures. Alternatively, the temperature may range from a sintering temperature to about the melting point of the material at process pressures.

In embodiments, the thermoelectric material may be selenides, antimonides, tellurides, sulfides, germanium compounds, and alloy mixtures thereof and dopants may be added and may include, for example, Br, Cl, I, Ga, In, Na, K, Ag, or other intentional impurities to change the electrical or thermal conductivity of the base material.

In other embodiments, the thermoelectric material may be lead selenide, lead sulfide, lead telluride, tin sulfide, tin telluride, silicon germanium and alloy mixtures thereof. In yet another embodiment, the material includes GeTe—AgSbTe$_2$ alloys (designated by the acronym TAGS for tellurium, antimony, germanium, silver).

In embodiments, a sintering time sufficient to affect the ZT and/or power factor of a thermoelectric material may range from about 30 seconds to about 24 hours. In yet another embodiment, the time may be from about 5 minutes to about 30 minutes. In still another embodiment, the time may be about 5 minutes to about 15 minutes.

In an exemplary embodiment, the thermoelectric material may include a material starting powder, where the material starting powder has an average grain size less than 1 μm to about 4000 μm. In other embodiments, the starting material may be a polycrystalline mass or one or more discrete single crystals.

Another embodiment may include a high pressure, high temperature (HPHT)-treated thermoelectric high purity material having a ZT and/or power factor that is higher than a material of the same composition that is not HPHT-treated. In embodiments, the thermoelectric material with a ZT and/or power factor that is higher than a material of the same composition that is not HPHT-treated, may be selenides, antimonides, tellurides, sulfides, germanium compounds, and alloy mixtures thereof. In other embodiments, the material may be lead selenide, lead sulfide, lead telluride, tin sulfide, tin telluride, and alloy mixtures thereof. In still other embodiments the material may be GeTe—AgSbTe$_2$ alloys.

BRIEF DESCRIPTION OF THE DRAWINGS

FIG. 5 shows a table listing properties for an embodiment.

FIG. 9 shows a table reporting the amount of indium dopant, the sintering temperature, the Seeback coefficient, the electrical conductivity, the thermal conductivity and ZT for embodiments.

DETAILED DESCRIPTION

Before the present methods, systems and materials are described, it is to be understood that this disclosure is not limited to the particular methodologies, systems and materials described, as these may vary. It is also to be understood that the terminology used in the description is for the purpose of describing the particular versions or embodiments only, and is not intended to limit the scope.

It must also be noted that as used herein and in the appended claims, the singular forms "a," "an," and "the" include plural references unless the context clearly dictates otherwise. Unless defined otherwise, all technical and scientific terms used herein have the same meanings as commonly understood by one of ordinary skill in the art. Although any methods, materials, and devices similar or equivalent to those described herein can be used in the practice or testing of embodiments, the preferred methods, materials, and devices are now described. All publications mentioned herein are incorporated by reference. Nothing herein is to be construed as an admission that the embodiments described herein are not entitled to antedate such disclosure by virtue of prior invention.

The present embodiments are illustrated in connection with a conventional HPHT apparatus which may be of the belt- or die-type described, for example, in U.S. Pat. Nos. 2,947,611; 2,941,241; 2,941,248; 3,609,818; 3,767,371; 4,289,503; 4,673,414; and 4,954,139; each of which is incorporated herein in its entirety. However, it will be appreciated that the method of the present invention will find applicability in any HPHT apparatus which is capable of providing the required HP and HT conditions simultaneously. Accordingly, it is intended that such other HPHT apparatuses are within the scope of the invention herein described.

Figure 1A:
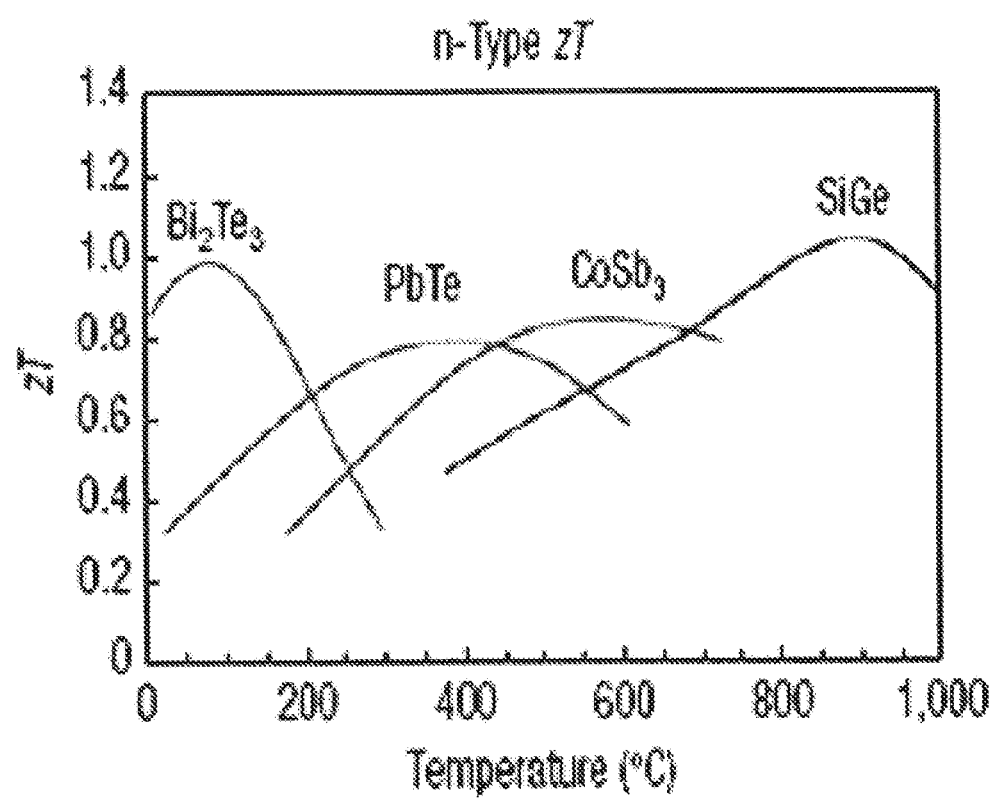
FIG. 1 shows graphs the ZT of various commercially available, non-HPHT sintered thermoelectric materials. (from Snyder, G. J.; Toberer, E. S., Complex thermoelectric materials. *Nature Materials* 2008, 7, 105-114)
Figure 1B:
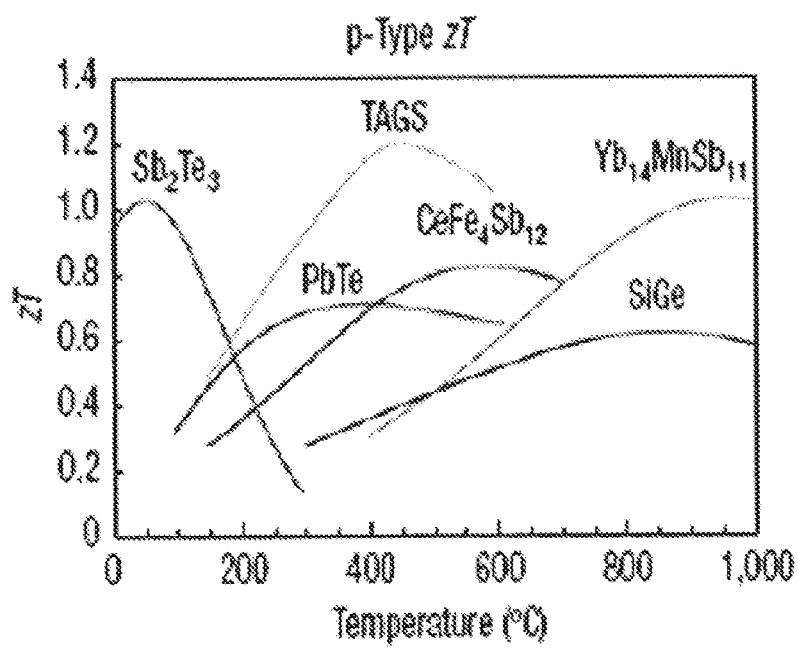
Figure 1C:
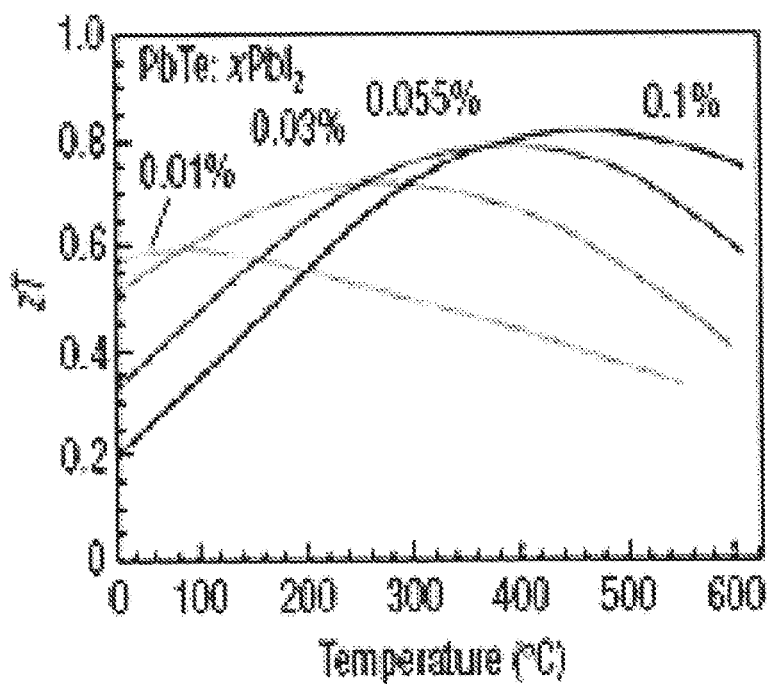
Figure 2:
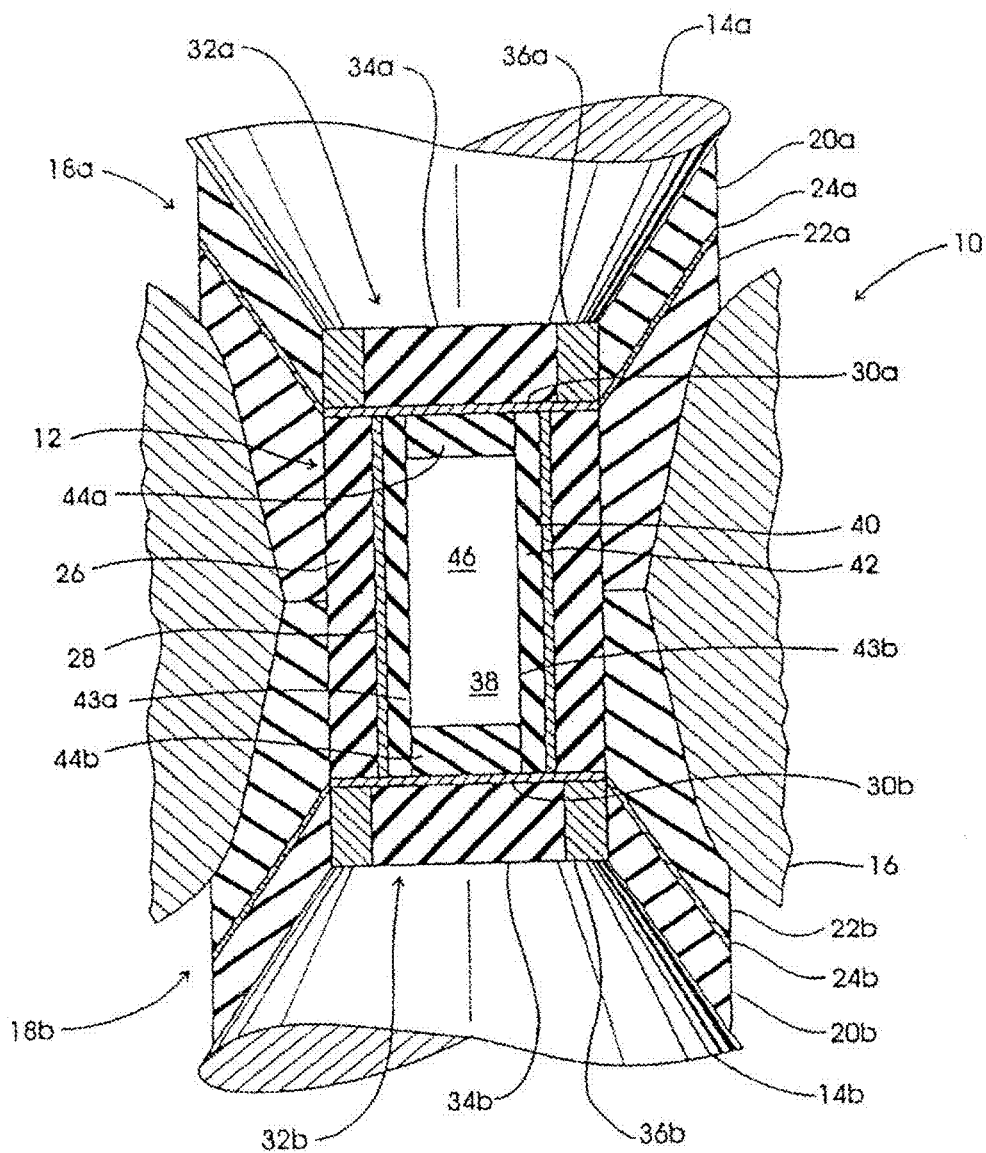
FIGS. 2 and 3 show cross-sectional views of an exemplary HPHT apparatus and cell which may be utilized to increase the ZT in a material.
Figure 3:
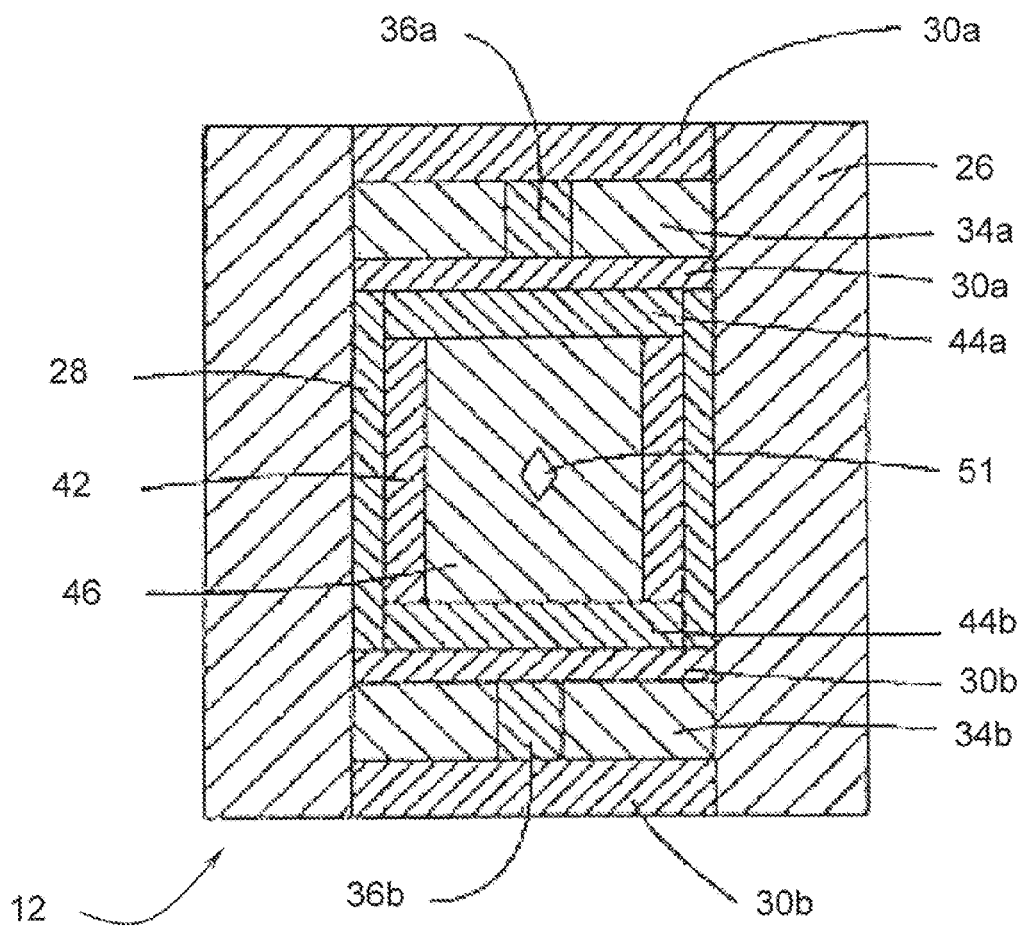

Looking to FIGS. 2 and 3, an illustrative HPHT apparatus useful in the practice of the present invention is shown generally at 10 to include a generally cylindrical reaction cell assembly 12 interposed between a pair of punches, 14a and 14b, and surrounded by a generally annular belt or die member 16. Preferably, both punches 14 and belt member 16 are formed of a relatively hard material, such as cemented tungsten carbide. Between punches 14 and belt member 16 are a pair of insulating assemblies, 18a and 18b, each of which is formed of a pair of thermally and electrically insulating members, 20a-b and 22a-b, in some embodiments formed of pyrophyllite or the like, and having an intermediate metallic or other gasket, 24a and 24b, disposed there between.

As shown, reaction cell assembly 12 includes a hollow cylinder 26, which may be formed of a material, such as salt or the like, which is converted during HPHT by phase transformation or compaction to a stronger, stiffer state or, alternatively, of a talc material or the like which is not so converted. In either case, the material of cylinder 12 is selected as being substantially free of volume discontinuities or the like, under HPHT as may occur, for example, with pyrophyllite or alumina materials. Materials meeting such criteria are described in U.S. Pat. No. 3,030,662, which is incorporated herein in its entirety.

Positioned within salt cylinder 26 is one or more adjacent cylinders 28, each of which is provided as a graphite electrical resistance heater tube. Electrical connection with heater tube 28 is achieved via an adjacent pair of conductive metal end discs, 30a and 30b, which are axially-disposed with respect to heater tube 28. Adjacent each disc 30 is provided an end cap assembly, shown generally at 32a and 32b, each of which includes an insulating plug, 34a and 34b, surrounded by an electrically conductive ring, 36a and 36b.

It will be appreciated that the interior of heater 28, along with end discs 30, salt cylinder 26, and end cap assemblies 32, defines a generally-cylindrical inner chamber, shown at 38, having defined axial and radial extents and containing a pressure-transmitting medium 46. Pressure-transmitting medium 46 is selected as having a relatively low coefficient of internal friction to make it semi-fluid at HPHT conditions, and may be provided as or within a cylindrical salt liner 42, which defines radial pressure-transmitting medium layers 43a and 43b, and is fitted with an axial pair of salt plugs, 44a and 44b, each of which defines an axial pressure transmitting medium layer. Preferably, pressure-transmitting medium 46, salt liner 42 and/or plugs 44 are formed of a graphite material or of sodium chloride, but also may be formed of any chloride, iodide, or bromide of sodium, potassium, or calcium or a mixture thereof. Alternatively, pressure-transmitting medium 46 may be provided in powdered or particulate form. In either case, medium 46 defines a cavity space, which is configured to receive the material 40 for HPHT processing with conditions sufficient to increase the ZT after recovery from HPHT processing. Such is the configuration of a representative HPHT apparatus for practicing the present invention.

In an embodiment, a method for increasing the ZT of a thermoelectric material includes creating a reaction cell with a material which is exposed to elevated pressure and elevated temperature for a time sufficient to increase the ZT of the material. The thermoelectric material with increased ZT is then recovered from the reaction cell. In an embodiment, the material 51 is shaped into a pellet before it is placed in a reaction cell.

In an embodiment for increasing the ZT of a thermoelectric material, the pressure ranges from about 1 GPa to about 20 GPa and the temperature ranges from about a third of the melting point temperature to about 500° C. above the melting point of the material at process pressures. In another embodiment, the pressure ranges from about 2 GPa to about 10 GPa. In yet another embodiment, the pressure ranges from about 4 GPa to about 8 GPa. In still another embodiment, the pressure is about 4 GPa.

The temperature ranges of an embodiment may be from about the temperature at which the thermoelectric material sinters together at process pressures. This may be about 600° C. to about 1300° C. In still another embodiment the temperature ranges from about 700° C. to about 900° C. Alternatively, the temperature ranges from about 900° C. to about the melting point of the material at the process pressures. In some embodiments, a preferred temperature range may be about +/−400° C. from the melting point of the material under elevated pressure.

For an embodiment of a method to increase and maintain for a period of time the ZT of a thermoelectric material, the material may include lead selenide, lead sulfide, lead telluride, tin sulfide, tin telluride, lead tin telluride, thallium tin telluride, thallium germanium telluride, and alloy mixtures thereof. In still yet another embodiment the material may be lead selenide, lead sulfide, lead telluride, tin sulfide, tin telluride, and alloy mixtures thereof. In another embodiment the material may be silicon germanium and alloy mixtures thereof. In yet another embodiment, the material may be GeTe—AgSbTe$_2$ alloys (designated by the acronym TAGS for tellurium, antimony, germanium, silver).

It is recognized that any neat, pure, or doped thermoelectric material or compound, including alloy mixtures thereof, which results in increased ZT when subjected to the HPHT treatments or HPHT sintering conditions described and claimed herein are within the scope of the instant claims. For example, dopants may be added and may include, for example, Br, Cl, I, Ga, In, Na, K, Ag, or other intentional impurities to change the electrical or thermal conductivity of the base material.

In one embodiment of a method to increase the ZT of a thermoelectric material is to expose the material to HPHT treatments described herein for about 30 seconds or longer up to about 24 hours. In another embodiment, the thermoelectric material may be exposed to HPHT treatments for about 30 seconds to about 15 minutes. In still another embodiment, the thermoelectric material may be exposed to HPHT treatments for about 5 minutes to about 30 minutes, preferably about 10 minutes.

In still yet another embodiment a method for increasing the ZT of the GeTe—AgSbTe$_2$ alloys includes creating a reaction cell with the alloys; exposing the reaction cell to a pressure ranging from about 4 GPa to about 6 GPa and a temperature from about 700° C. to about 900° C. for a time sufficient to increase the ZT of the, GeTe—AgSbTe$_2$ alloys and recovering the GeTe—AgSbTe$_2$ alloys with the increased ZT.

In one embodiment, the GeTe—AgSbTe$_2$ alloys are exposed to the HPHT treatment conditions for about 30 seconds or longer. In another embodiment, the GeTe—AgSbTe$_2$ alloys are exposed to the HPHT treatment conditions for about 5 minutes to about 15 minutes.

Another embodiment includes HPHT-treated high purity thermoelectric material that has a ZT that is higher than a material of the same composition that is not HPHT-treated. In an embodiment, high purity material is greater than or equal to 99.9% (w/w) pure. In another embodiment, high purity material is greater than or equal to 99.99% (w/w) pure. In still yet another embodiment, high purity material is greater than or equal to 99.999% (w/w) pure. In embodiments, the starting material may be a powder, a polycrystalline mass, one or more discrete single crystals, or any combination thereof. The average grain size of the material starting powder ranges from about 1 μm to about 4000 μm.

In an embodiment, the high purity thermoelectric material may be selenides, antimonides, tellurides, sulfides, germanium compounds, and alloy mixtures thereof. In another embodiment, the high purity material may be lead selenide, lead sulfide, lead telluride, bismuth telluride, tin sulfide, tin telluride, lead tin telluride, thallium tin telluride, thallium and germanium telluride, and alloy mixtures thereof. In another embodiment, the high purity material may be silicon germanium and alloy mixtures thereof. In yet another embodiment, the high purity material includes GeTe—AgSbTe$_2$ alloys (designated by the acronym TAGS for tellurium, antimony, germanium, silver).

It has been found that thermoelectric materials of embodiments discussed herein have demonstrated an increased ZT when measured at the pressure and temperature of use. The increased ZT is maintained when the thermoelectric material is exposed to the temperature of use for an extended period of time. Pressure of use is defined herein as about atmospheric pressure or less. Temperature of use is defined herein as about the temperature where the optimum ZT of the theremoelectric material is obtained. The temperature of use could be below room temperature, about room temperature, or above room temperature up to the range of about 1000° C. The upper bound for the temperature of use would be about the melting point of the thermoelectric material.

Embodiments discussed herein have shown an increased ZT compared to materials that have been conventionally sintered, and the materials have maintained the increased ZT for up to 10 days when kept at the use temperature.

Although the exact mechanism for obtaining enhanced thermoelectric properties is still being investigated, a plausible explanation can be advanced by referring to the concept of defect density within a crystalline material. At equilibrium, the number of vacancy defects is $n=Ne^{-(\epsilon+Pv_o)/k_BT}$, where N is on the order of Avogadro's number of atoms, P is the pressure, $v_o$ is the volume of each atom, $k_B$ is the Boltzmann's constant, and T is temperature (Ashcroft, N. W.; Mermin, N. D., *Solid State Physics*. Harcourt Brace: 1976). The implicit assumption is that the number of defects n<<N. We can see from the equation, that as pressure is increased, the equilibrium concentration of vacancies will decrease and this can lead to higher thermopower, power factor and ZT. However, upon pressure release, we have a system not at equilibrium with respect to the number of vacancy defects. But we have found that the system, although not thermodynamically stable, is kinetically stable.

EXAMPLE 1

The embodiments described herein relating to GeTe—AgSbTe$_2$ alloys consider improving the ZT of already-created alloys, after HPHT conditions that may have created it have been removed, and not continued processing of alloys. The GeTe—AgSbTe$_2$ alloys that are to be improved may be made by non-HPHT methods or HPHT methods. Exemplary methods of synthesizing GeTe—AgSbTe$_2$ alloys for use in the embodiments described herein include mixing or combining elemental Ge, Te, Ag and Sb in a processing device, and heating the mixture to about 800° C. to about 1000° C. under non-elevated pressure (i.e., a pressure that does not substantially vary from atmospheric pressure as compared to the HPHT conditions described above), so that the mixture melts and reacts to form GeTe—AgSbTe$_2$ alloys. Other methods of forming GeTe—AgSbTe$_2$ alloys are possible. The formed GeTe—AgSbTe$_2$ alloys may then be cooled and subsequently subjected to the HPHT conditions described herein in order to improve its ZT.

GeTe—AgSbTe$_2$ alloys: Ge pieces (99.999%, CERAC), Te ingot (99.9999%, Alfa Aesar), Ag shot (99.99%, CERAC), and Sb pieces (99.9999%, CERAC) were loaded into silica tubes (total sample mass of 15 g per tube) with the nominal stoichiometry of (GeTe)$_{1-x}$(AgSbTe$_2$)$_x$ (x=0.15) inside an Ar-filled glove box to minimize exposure of the reactants to air. A conservative estimate of the uncertainty in the loaded compositions, assuming an error of ±0.5 mg in weighing the starting materials, is about ±0.01%. Covered tubes were quickly moved to a vacuum line, evacuated (to 10$^{-3}$ Torr), and sealed with flame under vacuum. The tubes were heated to 850° C. over 13 hours, held at this temperature for 4 hours. During this time at 850° C., the tubes were gently shaken every hour to ensure homogeneity of the melts. The furnace was then turned off and the reaction tubes cooled to room temperature. After cooling, the tubes were reheated to 450° C. over 6 hours, held at this temperature for 40 hours, the furnace was turned off, and the tubes were allowed to cool down to room temperature.

HPHT sintering: Powders were obtained by crushing the material in an agate mortar and pestle, in an Ar filled glove box (LabMaster, M. Braun, Inc.) maintained at <about 1 ppm O$_2$ and H$_2$O, and sieving to be between about 50 to about 100 μm particle sizes. Pellets were pressed on a hydraulic press to >about 90% theoretical density, then encased in high purity graphite (NAC-500, NAC Carbon Products, Inc.). This was then assembled into a high pressure cell, with an integrated heater circuit, and pressed on a uniaxial belt type apparatus. All high pressure cell components were stored under vacuum at about 150° C. prior to use and the assembled cells were stored in the Ar filled glove box until immediately prior to pressing. Pressure was estimated by monitoring the irreversible densification of silica (the method described in Arndt, J.; Stöffler, D., Anomalous changes in some properties of silica glass densified at very high pressures. *Physics and Chemistry of Glasses* 1969, 10, (3), 117-124). The temperature calibration was done by measuring in situ with a K-type thermocouple inserted in the cell. HPHT sintering was accomplished with total time at soak temperature and pressure of 10 minutes. After HPHT treatment, samples were cut into several rectangular bars with approximate dimensions of 0.5×0.3×0.3 cm by wire EDM (electrical discharge machining).

Sample densities were measured using a He gas pycnometer (Micromeritics AccuPyc 1330). X-ray diffraction (XRD) was done with sample spinning at 30 rpm, on a Bruker D8 instrument equipped with a solid state detector (Sol-X) using Cu Kα radiation generated at 40 kV and 40 mA. The software package Jade was used for analysis of the XRD data. TEM images were taken using a FEI Tecnai T-12 TWIN TEM system. Finely ground powder samples were suspended in ethanol and dropped on a TEM grid (carbon coated Cu grid).

Properties measurements: The surfaces of the bars were cleaned with SiC sandpaper and washed with hexane to remove any remaining dust on the surface prior to characterization. Measurements of thermopower and electrical resistivity were performed at high temperature. A conservative estimate of errors for the measurement are within ±5% for S and ±10% for ρ. Thermopower and electrical resistivity were measured with two samples that were cut from adjacent parts of the HPHT pellet. One was used for thermopower measurements and another one for electrical resistivity measurements. Contacts to the ends of the bar shaped sample were made using silver epoxy (Epotek H20E), and used for current contact for ρ measurements, and heater/heat sink contacts for S measurements. The voltage contacts for the ρ measurements were made using fine gauge copper wire and silver epoxy (Epotek H20E). Thermocouples for S measurements were attached using silver epoxy (Epotek H20E).

Thermal conductivity measurements were made using an instrument designed at Cornell University (for a description of this instrument see Reynolds, T. K.; McGuire, M. A.; DiSalvo, F. J., Thermoelectric properties and antiferromagnetism of the new ternary transition metal telluride CrAuTe$_4$. *Journal of Solid State Chemistry* 2004, 177, 2998-3006). A separate instrument (described below; designed and built at Cornell University), was used to make measurements of Seebeck coefficient and electrical resistivity from room temperature up to 400° C. Among the features of the instrument are accurate temperature control and measurement, which are critical to measurement of both properties.

Temperature of the tube furnace (Applied Test System, Inc. 3110) was controlled by a temperature controller (Applied Test System, Inc, 2010) that sets and maintains the operational point to within ±0.2% of thermocouple range. All temperature sensors were either 0.01 or 0.005 inch diameter K-type chromel-alumel (Nanmac Corp.) thermocouple wires. These were chosen because of their stability and resistance to oxidation up to 1000° C. and because their calibration data are reliable and reproducible. The thermocouple signal was converted directly into temperature values with a resolution of 0.001° C. using a Fluke 8505A digital multimeter. Typical temperature stability during measurement of a sample was between ±0.2° C. and ±0.5° C. in the range from room temperature to 400° C. Greater stability was observed at lower temperatures. An electronic cold junction compensator from Omega Inc. provided stable reference temperatures (0±0.2° C.) for the thermocouples.

For Seebeck coefficient measurements, two thermocouples were attached to the sample, one at each end. Grooves were made, using a file, along the axial direction of the sample and filled with silver epoxy. The thermocouples were then set in the epoxy filled grooves and the sample was heated in a dry oven for 30 mins to cure the silver epoxy. To set up a temperature gradient along the length of the sample, a 6 kΩ resistor (¼ W) wrapped with copper foil was attached to one end of the sample and the other end was set with silver epoxy to a removable copper screw which attached to the sample stage to act as a heat sink The entire assembly was then inserted into a fused silica tube to be placed in a furnace. To ensure that the temperature measurements and the voltage measurements occur at the same position, all the quantities to be measured were connected to different channels on the scanner (Fluke 2205A Switch Controller). The thermocouples were connected to the scanner via a connector box that allows for the splitting of the thermocouple signals in order to read the voltage across the sample.

In order to make a measurement, the furnace was heated and allowed to stabilize for ~30 mins at the temperature set point. Then the sample heater was turned on to a predetermined power setting to establish a temperature difference. Typically, the target temperature difference between the two ends was 3-4 K. While the sample was coming to equilibrium, temperature and voltage differences between the ends of the sample were measured at a rate of about two to three data points per second. This data could be fit to an exponential function of $\Delta T$ versus time to obtain the value of $\Delta T$ if the sample were allowed to reach equilibrium. This extracted $\Delta T$ value can be obtained in several thermal time constants (typically as little as 30-40 s depending on the thermal conductivity of the sample), and agrees well with values obtained when the sample is allowed to reach true steady state.

The sample heater was then turned off and while the sample was cooling, the sample voltage and the roughly exponential decay of $\Delta T$ with time were again monitored. The cooling $\Delta T$ curve was fit in a similar manner to the heating curve, and a zero point offset is obtained for $\Delta T$. The slope from a linear fit of V versus $\Delta T$ gives the uncorrected thermopower. Since the voltage contacts are made with Chromel wires, the Seebeck coefficient for these wires must be subtracted from the measurements to find the Seebeck coefficient of the sample. The Seebeck coefficients obtained from the heating and cooling curves were then averaged to give a final value for the Seebeck coefficient. The error is estimated to be ±5%.

Electrical resistivity was measured by a four-probe AC method using a Linear Research LR-700 AC resistance bridge with the excitation frequency of 16 Hz in our measurements of electrical resistivity.

Results: TAGS adopts a rhombohedral ($R_{3m}$) crystal structure with extensive twinning near room temperature, which then transforms to a cubic lattice ($F_{m-3m}$) as temperatures approach 600 K. After HPHT sintering, the diffraction peaks (FIG. 4) display some intensity shifts, of which the most striking are the peak doublets at ~43° and ~53° in 2-theta.

Figure 4:
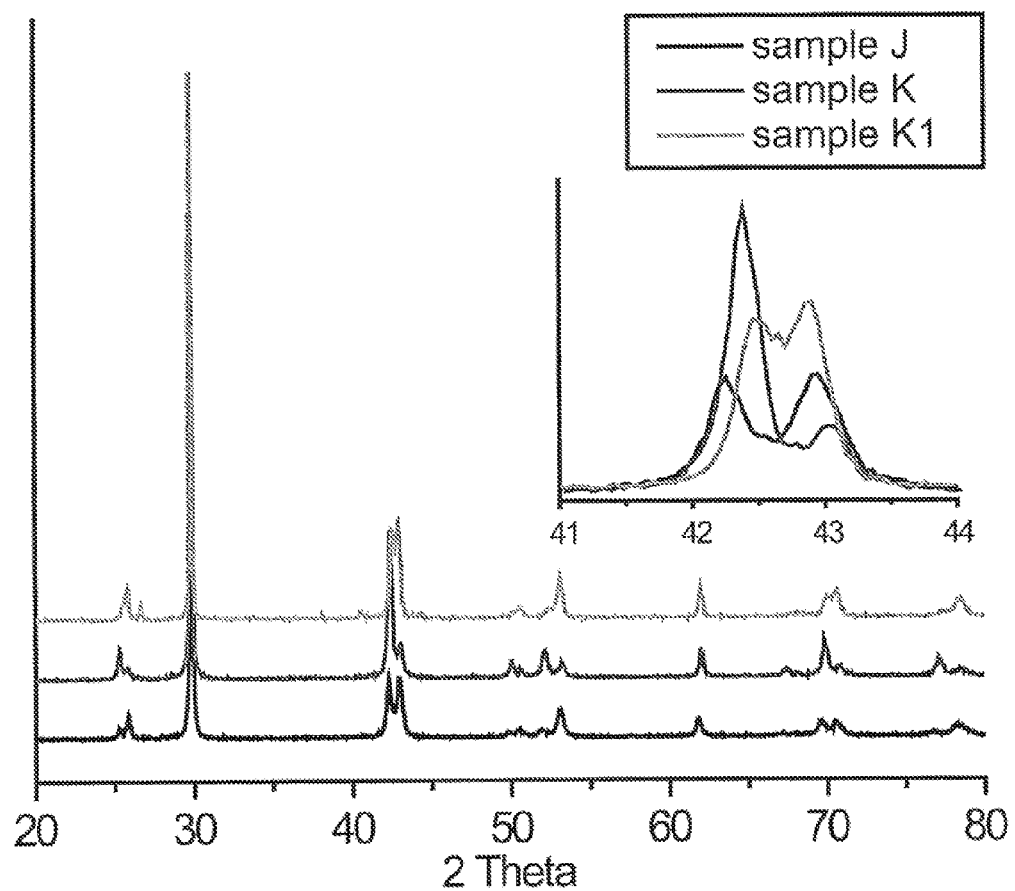
FIG. 4 show X-ray diffraction peaks of an embodiment.

Analysis of the lattice parameters shows that the rhombohedral unit cell angle of the non-HPHT sintered sample is 89.12°, similar to what is reported for the TAGS-85 composition (89.15°). FIG. 4 shows X-ray diffraction patterns of TAGS-85 conventionally synthesized (sample J), HPHT sintered TAGS-85 (sample K), and after temperature cycling to 400° C. (sample K1). Relative peak intensities change after HPHT sintering and then again after thermal cycling. All of the peaks can be indexed to the rhombohedral phase with space group $R_{3m}$. The inset illustrates the scale of the intensity shift.

The measured angle after HPHT sintering is 89.17°, slightly larger but within error equal to that for conventional TAGS-85. A tabulation of the rhombohedral angles for HPHT sintered samples (FIG. 5) shows that they are all similar to conventional TAGS-85. In fact, sample C (FIG. 5) was pressed under the same nominal HPHT conditions as sample K and the measured rhombohedral angles were 89.12° and 89.17° respectively.

Subsequently, after the HPHT sintered material is cycled to 400° C., the peak intensities shift again, but do not completely revert back to the XRD pattern of the non-HPHT sintered material, suggesting, qualitatively, that high pressure sintering has induced a permanent change in the materials structure. The rhombohedral angle is now 89.25° which is a significant, albeit small, change. After this initial exposure to elevated temperature, the HPHT sintered material is remarkably stable to further exposure to ~400° C. In our initial attempts to measure thermoelectric (TE) properties, we found that resistivity and thermopower shifted unpredictably as the samples were heated gradually to 400° C. After the initial exposure to elevated temperature, TE properties were stable and could be measured reproducibly. All of the TE properties measurements that are presented here were taken on material that had first been cycled to 400° C.

As is evident from FIG. 5, a sintering pressure of 4.0 GPa usually resulted in mechanically robust materials, whereas higher and lower sintering pressures (samples G, H, and I) yielded materials that were too splintered and fragile to measure thermoelectric properties. Samples H and I were also poorly crystallized and their rhombohedral angles could not be determined. All our attempts to sinter TAGS-80 at pressures of 4.0 and 4.5 GPa and at temperatures ranging from 550 to 850° C. resulted in materials too brittle to handle or measure. However, the X-ray diffraction of these HPHT sintered TAGS-80 again reveal differences compared to conventional material.

Figure 6:
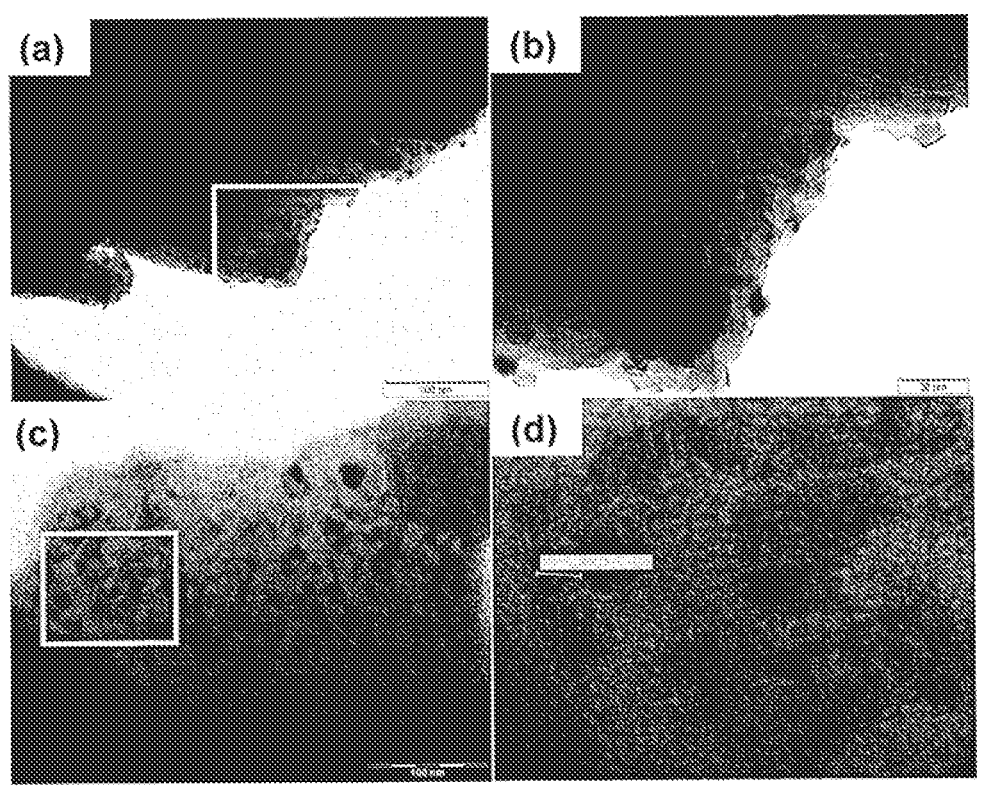
FIG. 6 shows TEM images of embodiments.

TEM (transmission electron microscope) images of HPHT sintered sample (C) before and after cycling to high temperatures show dramatic changes in the microstructure. The HPHT sintered material possesses nanosized domains (10-15 nm domain size) which are dispersed throughout the bulk (FIGS. 6a and 6b). These nano particles appear highly crystalline. However, they are too small to be the source of the intensity shifts in the XRD pattern. After cycling to 400° C., the nanoparticles become more textured (FIGS. 6c and 6d).

Figure 7:
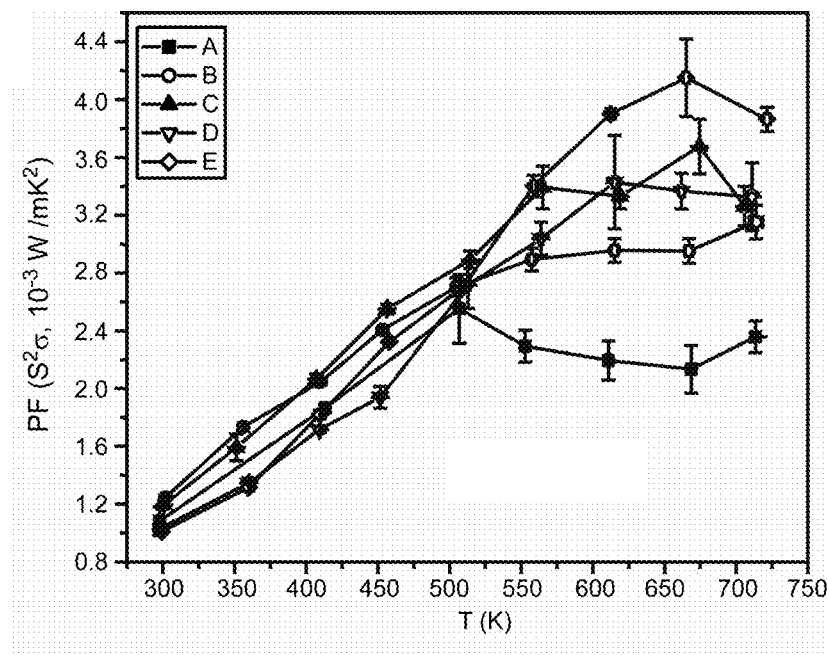
FIG. 7 shows a graph for thermopower for embodiments.

FIG. 7 shows the highest power factor ($PF=S^2\sigma$) attained for HPHT sintered TAGS-85 ($4.32\times10^{-3}$ W m$^{-1}$ K$^{-2}$, sample D). Samples A through E were sintered at 4.0 GPa, with steadily increasing sintering temperature. The power factor also shows a steady progression, reaching a maximum at a sintering temperature of 800° C., with a subsequent decrease, at the highest sintering temperature of 850° C. Comparing samples F and C, which were both sintered at 750° C., it is apparent that lower pressure (3.5 GPa, sample F) is inimical to TE performance. As mentioned earlier, materials sintered at pressures higher and lower than 4.0 GPa, (samples G, H, and I) were mechanically fragile as well. These results show that HPHT sintering conditions are critical in obtaining not only well sintered, robust materials but also in obtaining good thermoelectric properties.

Figure 8:
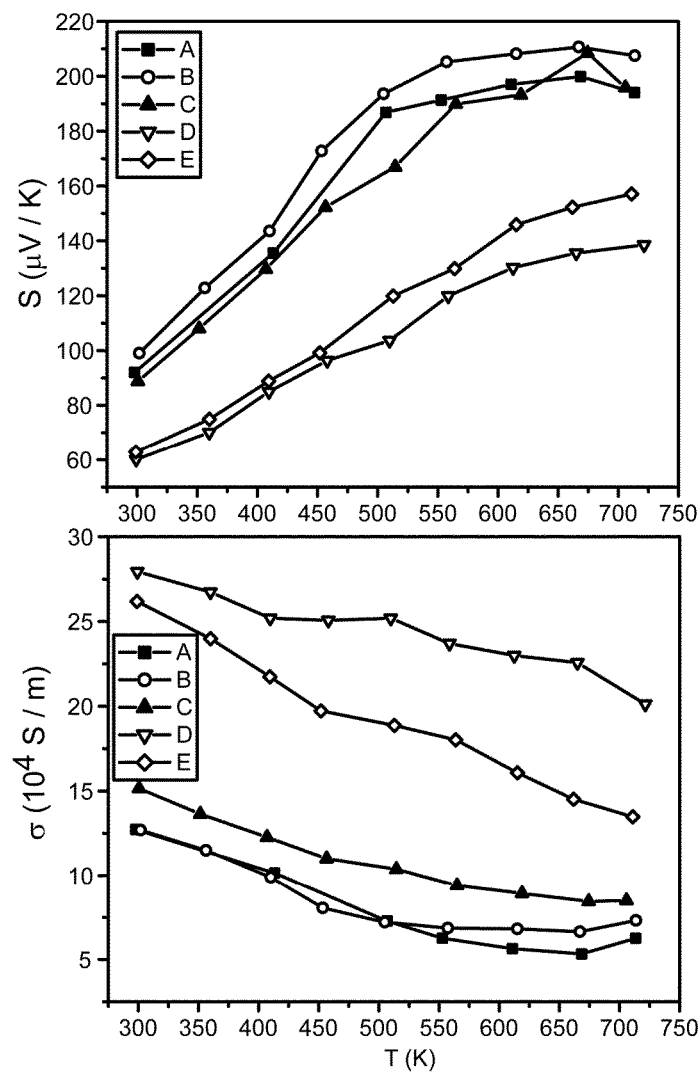
FIG. 8 shows a graph for electrical conductivity for embodiments.

FIG. 8 shows the temperature dependent thermopower (top) and the electrical conductivity (bottom) of samples A-E. Samples A-C exhibit clearly distinct behavior as compared to samples D and E. Generally, samples A-C have similar thermopower which at first increases with temperature and then drops slightly after 650 K. Samples D and E, in contrast, have linearly increasing thermopower up to the measured temperature. Electrical conductivity follows a similar pattern, with samples A-C decreasing up to 650 K and increasing slightly above 650 K, whereas that of samples D and E is decreasing through the measured temperature range. The highest thermopower (214 µV/K at 650 K) is obtained with B, whereas the highest conductivity (22.8×10$^4$ S/m at 650 K) is obtained with D. Thus, the high power factor is a result of higher conductivity. Samples D and E were sintered at a relatively higher temperature (800 and 850° C. respectively) and the linear temperature dependence of thermopower and electrical conductivity indicate that these materials are likely to be degenerate semiconductor.

For metals or degenerate semiconductors, the Seebeck coefficient can be described by $$S = \left(\frac{8\pi^2 k_B^2 T}{3eh^2}\right) m^* \left(\frac{\pi}{3n}\right)^{2/3}$$

(see Salvador, J. R., et al., *Transport and mechanical property evaluation of $(AgSbTe_2)_{(1-x)}(GeTe)_{(x)}$* (x=0.80, 0.82, 0.85, 0.87, 0.90). Journal of Solid State Chemistry, 2009. 182(8): p. 2088-2095), where n is the carrier concentration, $k_B$ is the Boltzmann constant, h is Planck's constant, e is the charge of an electron, and m* is the effective mass of the carrier. Electrical conductivity is related to n through the carrier mobility μ, σ=neμ. All of these samples were sintered from the same powder batch. Thus, we would expect the carrier concentration, n, to be nominally the same. From these considerations, high sintering temperature is likely to introduce high mobility (increasing electrical conductivity) and low effective mass of carriers (decreasing thermopower).

The amount of indium dopant, the sintering temperature, the Seeback coefficient was plotted from the electrical conductivity, the thermal conductivity and ZT as shown in FIG. 9. The highest previous reported power factor for TAGS-85 is ~3.2×10-3 W/m K2 (see Yang, S.H., et al., Nanostructures in high-performance (GeTe)(x)(AgSbTe2)(100-x) thermoelectric materials. Nanotechnology, 2008. 19(24): p. 245707), and it is evident that samples C, D, and E exceed this value. Although sample D has the highest power factor, it has a relatively low thermopower.

A thermal conductivity, at 300 K, of 1.6 and 2.7 W/m-K was measured, for samples C and D respectively. The former value is similar to what has been previously reported for TAGS-85. Since D has much higher electrical conductivity, its thermal conductivity is correspondingly higher. The thermal conductivity of TAGS-85 is relatively independent of temperature up to 750K.

EXAMPLE 2

The embodiments described herein relating to $Pb_{0.5}Sn_{0.5}Te$ alloys doped with In consider improving the ZT of already-created alloys, after HPHT conditions that may have created it have been removed, and not continued processing of alloys. The $Pb_{0.5}Sn_{0.5}Te$ In doped alloys that are to be improved may be made by non-HPHT methods or HPHT methods. Exemplary methods of synthesizing $Pb_{0.5}Sn_{0.5}Te$ alloys for use in the embodiments described herein include mixing or combining elemental Pb, Sn, Te and In in a processing device, and heating the mixture to about 800° C. to about 1000° C. under non-elevated pressure (i.e., a pressure that does not substantially vary from atmospheric pressure as compared to the HPHT conditions described above), so that the mixture melts and reacts to form $Pb_{0.5}Sn_{0.5}Te$ alloys doped with In. Other methods of forming $Pb_{0.5}Sn_{0.5}Te$ alloys are possible. The formed $Pb_{0.5}Sn_{0.5}Te$ alloys doped with In may then be cooled and subsequently subjected to the HPHT conditions described herein in order to improve its ZT.

High purity Te ingot (99.9999%, Alfa Aesar), Pb shot (99.9999%, Alfa Aesar), Sn shot (99.9999%, Alfa Aesar), and In powder (-325 mesh, 99,999%, Alfa Aesar) were used without further purification. $Pb_{0.5}Sn_{0.5}Te$ samples with nominal In dopant concentrations of 1.0, 2.0, and 3.0 (×10$^{19}$/cm$^3$) were prepared with Pb, Sn, Te, and In which were weighed according to the nominal stoichiometry of $Pb_{1-x-y}Sn_xIn_yTe$. The elements were loaded into silica tubes (total sample mass of 15 g per tube) inside an Ar-filled glove box to minimize exposure of the reactants to air. A conservative estimate of the uncertainty in the loaded compositions, assuming an error of ±0.5 mg in weighing the starting materials, is about ±0.01%. Covered tubes were quickly moved to a vacuum line, evacuated (10$^{-3}$ Torr), and sealed with flame under vacuum. The tubes were heated to 950° C. over 15 h, held at this temperature for 3 h, and then the furnace was turned off and the reaction tubes cooled to room temperature. The samples had clearly melted to form a solid slug on cooling to room temperature ($Pb_{0.5}Sn_{0.5}Te$ melts at ~850° C.). [Linden, 1969 #389} Powder X-ray diffraction showed the product to be single phase with the NaCl structure type. At the measured diffraction signal to noise levels, if any second phase is present, it is limited to less than a few percent.

HPHT sintering: HPHT sintering was performed at Diamond Innovations Inc (DI). Materials synthesized at Cornell University were transported to DI in vacuum sealed fused silica tubes. Powders were obtained by crushing the material in an agate mortar and pestle, at DI, in an Ar filled glove box (LabMaster, M. Braun, Inc.) maintained at <1 ppm $O_2$ and $H_2O$, and sieving to be between 50 to 100 μm particle sizes. Pellets were pressed on a hydraulic press to >90% theoretical density, then encased in high purity graphite (NAC-500, NAC Carbon Products, Inc.). This was then assembled into a high pressure cell, with an integrated heater circuit, and pressed on a belt type apparatus. All high pressure cell components were stored under vacuum at ~150° C. prior to use and the assembled cells were stored in an Ar filled glove box until immediately prior to pressing. Pressure was estimated by monitoring the irreversible densification of silica[Arndt, 1969 #289} and temperature calibration was done by measuring in situ with a K-type thermocouple inserted in the cell. HPHT sintering was accomplished with total time of 10 minutes at the soak temperature and a pressure of 4.0 GPa. After HPHT treatment, samples were cut into several rectangular bars with approximate dimensions of 0.5×0.3×0.2 cm by wire EDM (electrical discharge machining).

Properties measurements: The surfaces of the bars were cleaned with SiC sandpaper and washed with hexane to remove any remaining dust on the surface prior to characterization. Measurements of TE properties were performed over the temperature range of 80-300 K using a home built apparatus described elsewhere.[Reynolds, 2004 #326} A conservative estimate of errors for the measurement are within ±5% for S, ±10% for ρ, and ±10% for κ.[Reynolds, 2004 #568} TE properties were measured with two samples simultaneously. One was used for thermopower and thermal conductivity measurements and another one for electrical resistivity measurements. Copper was deposited onto the ends of the samples electrochemically using $CuSO_4$ dissolved in diluted $H_2SO_4$. Good thermal and electrical contacts could then be made by soldering onto the samples using indium metal for the measurement of thermal conductivity κ, thermopower S, and electrical resistivity ρ. The voltage contacts for the resistivity measurements were made using fine gauge copper wire and silver epoxy (Epotek H20E, Ted Pella).

For high temperature thermopower and electrical resistivity measurements [ref], contacts to the ends of the bar shaped sample were made using silver epoxy (Epotek H20E), and used for current contact for ρ measurements, and heater/heat sink contacts for S measurements. The voltage contacts for the ρ measurements were made using fine gauge copper wire and silver epoxy (Epotek H20E). Thermocouple wires for S measurements were attached using silver epoxy (Epotek H20E).

The results, at 300 K, for HPHT sintered $Pb_{0.5}Sn_{0.5}Te$ with In doping of 1.0, 2.0, and $3.0 \times 10^{19}/cm^3$ are summarized in the table in FIG. 9. To facilitate comparison with literature data (see Gelbstein, Y.; Dashevsky, Z.; Dariel, M. P., In-doped Pb0.5Sn0.5Te p-type samples prepared by powder metallurgical processing for thermoelectric applications. *Physica B-Condensed Matter* 2007, 396, (1-2), 16-21), the In concentrations are 0.03, 0.07, and 0.1 atom %, respectively. In an initial set of experiments, samples with each In doping level were sintered at 800 and 900° C. (A through H). In order to simulate use conditions, one set of samples (A1 through H1) were aged at 400° C. for 10 days in vacuum (sealed silica tube) prior to measurement while the remaining set were not exposed to this high temperature. (Note that for sample F1, we do not have the matching data set F.)

Figure 10:
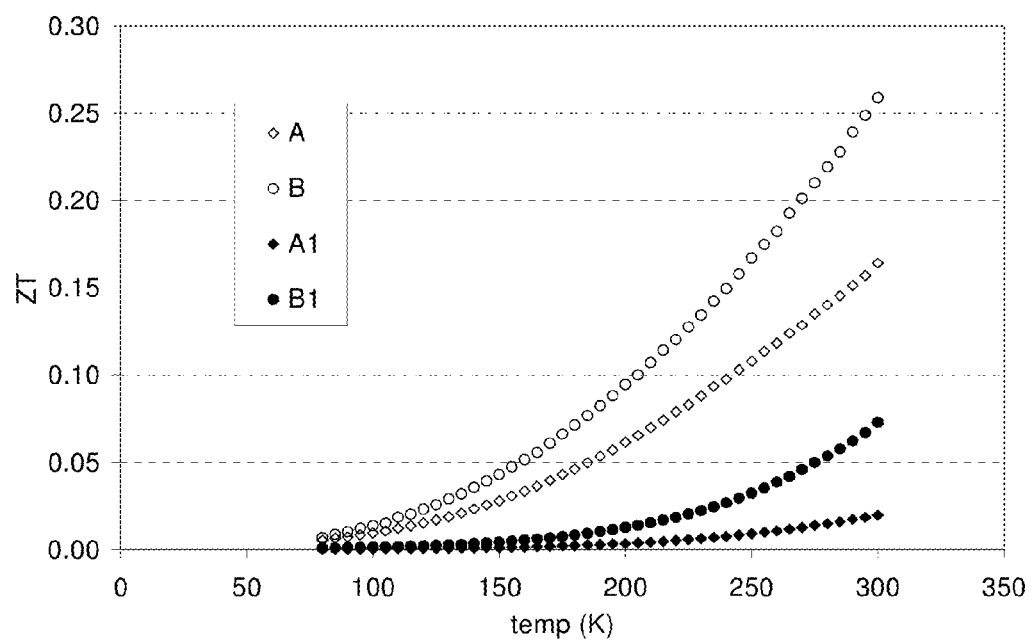
FIG. 10 shows a graph ZT v. temperature for embodiments.
Figure 11:
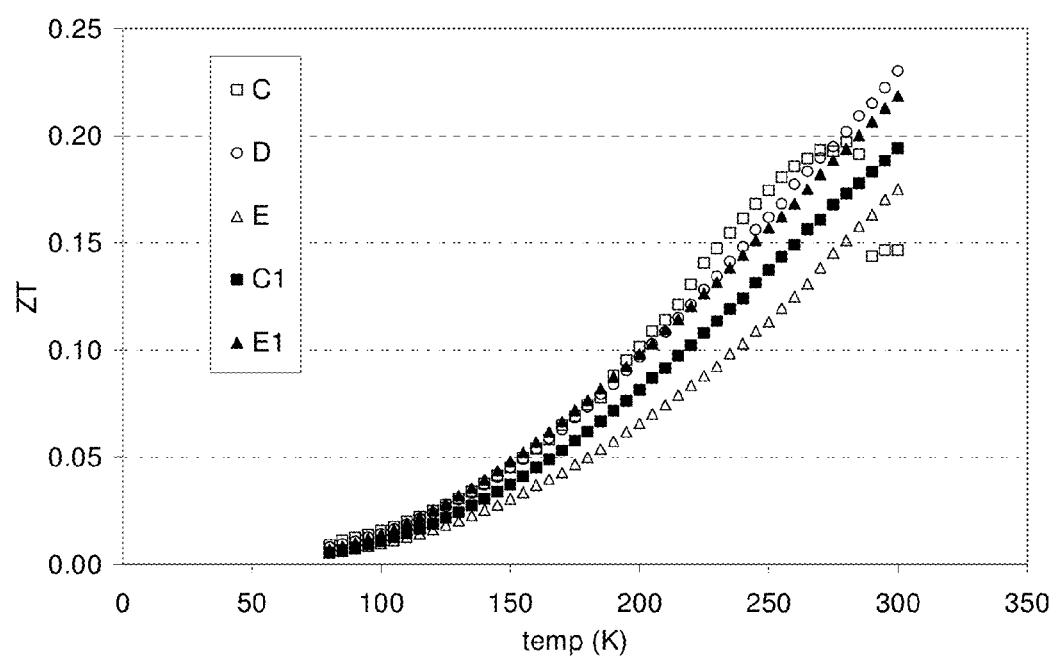
FIG. 11 shows a graph ZT versus temperature for embodiments.

The plot of ZT versus temperature from 80 to 300 K is shown in FIG. 10 for samples A, B, A1, and B1. It is apparent that, after being aged for 10 d at 400° C., the performance of these HPHT sintered materials has degraded significantly. FIG. 11 shows a similar plot for samples C, D, E, C1, and E1. In this case, the performance of the HPHT sintered materials, after being aged for 10 d at 400° C., remains essentially unchanged. The only difference between these 2 sets of samples is the sintering temperature at HPHT. In FIG. 10, the samples were sintered at 800° C., whereas in FIG. 11, the samples were sintered at 900° C. This suggests that the exact HPHT sintering conditions is necessary to obtain materials with long term stability at the use temperature.

Looking more closely at the data listed in FIG. 9, the samples that were sintered at 900° C. show no significant changes in thermopower and thermal conductivity (sample C1 and E1 compared to samples C and E), but electrical conductivity increases after heat exposure. This leads to a higher figure of merit for C1 and E1. Comparing samples D to D1, electrical conductivity increases 3-fold and this leads to increasing total thermal conductivity (~25%) and Seebeck coefficient is reduced by ~50%. Overall, the ZT decreases by ~50%.

For the two samples sintered 800° C., thermopower decreases by ~50% in both cases and thermal conductivity increases. However, electrical conductivity does not follow a clear trend, decreasing from A to A1 but increasing by 3-fold from B to B1. Overall, the ZT is decreased for both.

We have repeated the experiments with In doping of $2 \times 10^{19}/cm^3$ and for sintering temperatures of 925 and 950° C. to determine if our observations are repeatable and to determine the role of sintering temperature at high pressures. Sample F1 is a duplicate of D1 and exhibits similar properties. Comparing samples G to G1 and H to H1, we see that the overall behavior is similar to samples D and D1. The thermopower is still diminished by ~50%, and the electrical conductivity almost doubles. There is also a substantial increase in total thermal conductivity. This suggests that, above a minimum sintering temperature threshold, slight variations in sintering temperature do not have an appreciable effect on overall properties.

These large changes in thermoelectric properties between samples sintered at high pressures and at different temperatures cannot be easily explained by changes in stoichiometry. In each case, the samples were made from the same powder batch, the only difference being their sintering temperature at HPHT. Furthermore, the samples exhibited very different behavior upon exposure to high temperature. These observations may be explained by the energy required for lattice defects to be 'annealed' out of the system. As explained above, higher pressure would favor lower defect concentrations at equilibrium. But the kinetics for reducing lattice defects would be faster at a higher sintering temperature.

It is apparent that the concentration of charge carriers, both holes and electrons, is changing upon exposure to 400° C. and that the HPHT sintering temperature has some effect on the transport properties. HPHT sintering at 900° C. appears to yield samples that are somewhat more stable to heat exposure. The ZT values of D1 and F1 are relatively unchanged compared to that of D and F. Although the ZT of E1 is ~50% less than that of E, it is still larger than that of B1. Going to still higher sintering temperature of 925 or 950° C. does not seem to yield any further stability.

Figures 12A, 12B:
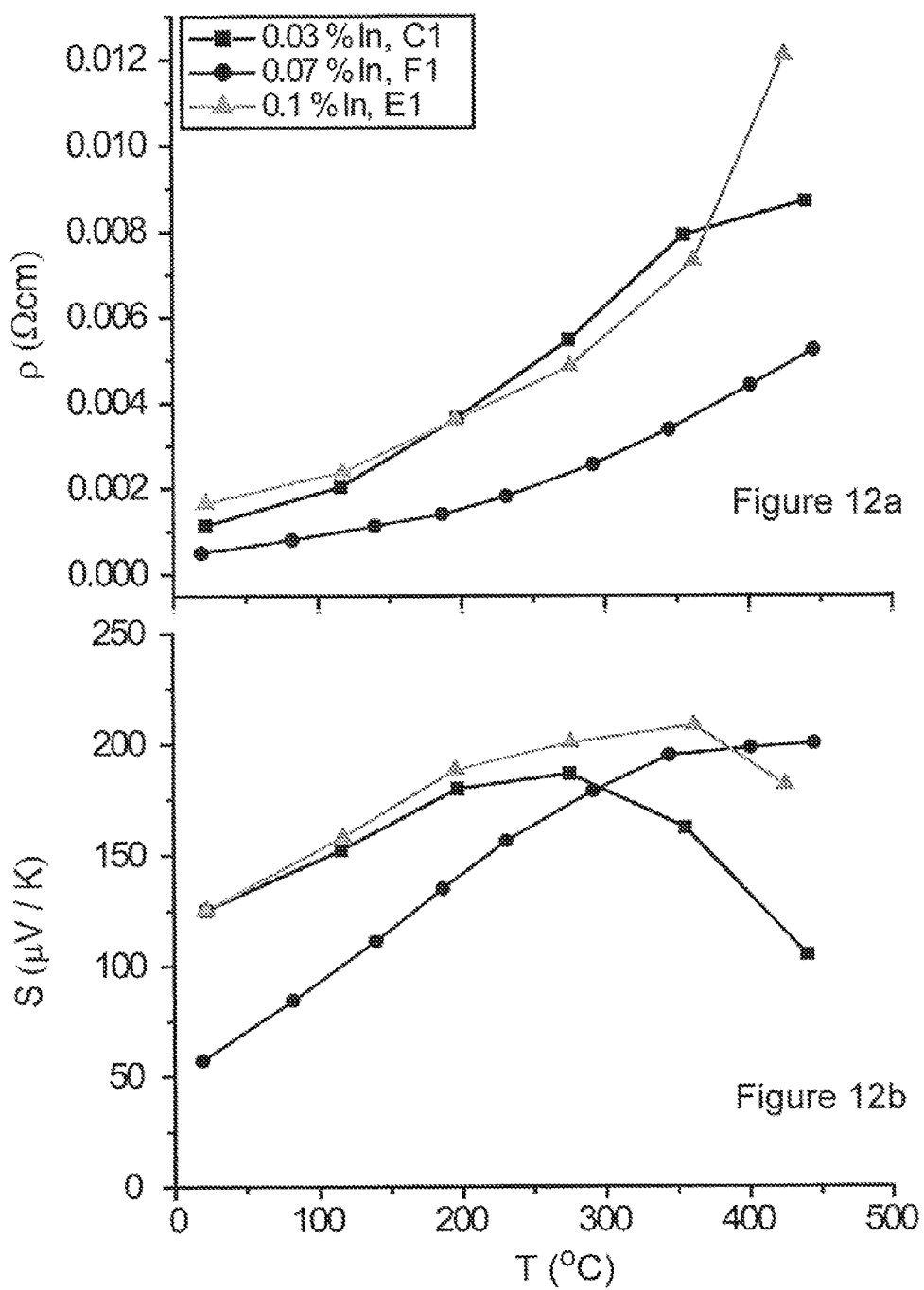
FIGS. 12a and 12b are graphs of electrical resistivity and Seebeck coefficient for embodiments.
Figure 13:
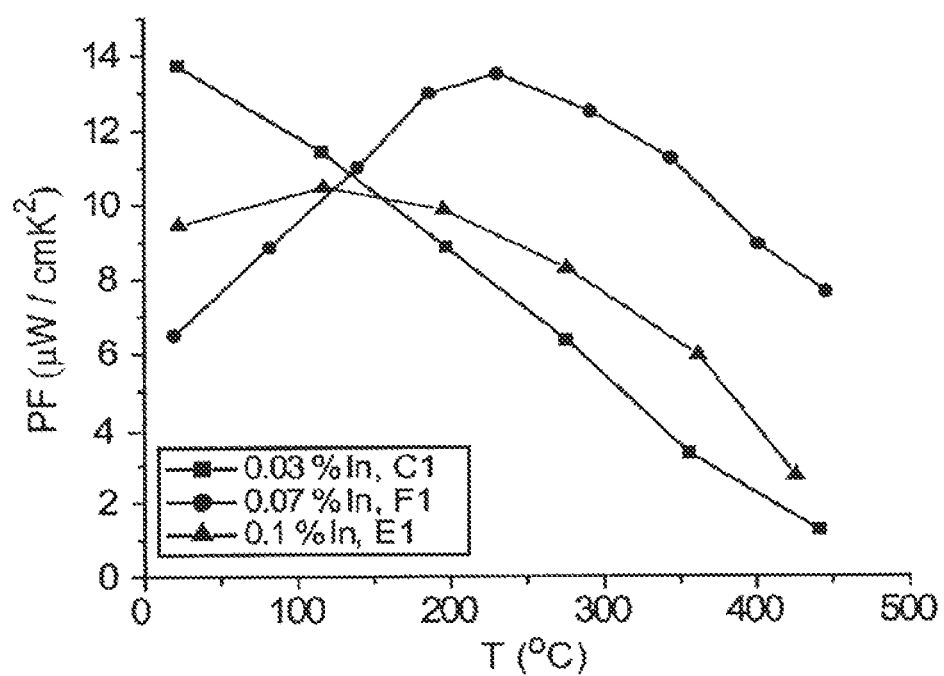
FIG. 13 shows the power factor for embodiments.

FIG. 12 shows the measured electrical resistivity and Seebeck coefficient in the temperature range from room temperature to 450° C., for $Pb_{0.5}Sn_{0.5}Te$ at the three In doping levels. Each sample, C1, E1, and F1 was HPHT sintered at 900° C. and then exposed to 400° C. for 10 d before measurements were made. The electrical resistivity of all samples increases with temperature, indicating degenerate semiconducting behavior. Up to about 300° C., higher electrical resistivity is accompanied by higher thermopower, as expected. But beyond 300° C., the thermopowers of samples with In doping at 1.0 and $3.0 \times 10^{19}/cm^3$ level off and then decline while that of the sample (F1) with In doping at $2.0 \times 10^{19}/cm^3$ continues to rise. The corresponding power factor for these samples, given in FIG. 13, show that In at a nominal doping of $2.0 \times 10^{19}/cm^3$ yields high values in the temperature range 200 to 350° C. The peak value, at ~250° C., is 13.5 $\mu W/cm-K^2$.

The high temperature thermal conductivity of sample F1 has been obtained by the flash diffusivity-specific heat method. High temperature thermal conductivity was calculated from the equation $\kappa = DC_p\rho$ where D is the thermal diffusivity; $C_p$ is the specific heat; ρ is the density of the sample (determined to be 7.13 $g/cm^3$ by He pycnometry). Errors in such measurements could arise from the sample geometry for high temperature thermal diffusivity. Thermal diffusivity is expressed by the equation, $D = (K_x l^2/t_x)$, where $K_x$ is a constant corresponding to x percent temperature rise, l is the thickness of the sample and $t_x$ is the elapsed time to x percent rise. Errors in any one of these measurements would be compounded. Conservatively, we estimate that the error is ~20%.

Figure 14:
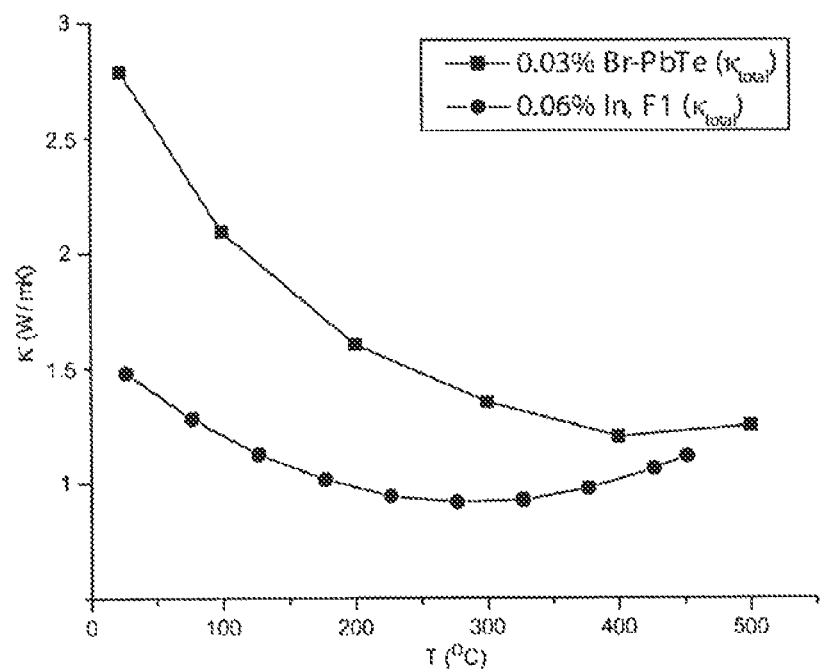
FIG. 14 shows the total thermal conductivity for embodiments.

FIG. 14 shows the total thermal conductivity in the temperature range up to 450° C. for the In doped sample F1. Also shown, for comparison is the thermal conductivity for HPHT sintered PbTe doped with Br ($1 \times 10^{19}/cm^3$) (see Dong, Y.; McGuire, M. A.; Malik, A.-S.; DiSalvo, F. J., Transport properties of undoped and Br-doped PbTe sintered at high-temperature and pressure >4.0 GPa. *Journal of Solid State Chemistry* 2009, 182, 2602-2607).

We would expect the thermal conductivity for un-alloyed PbTe to be higher and this is borne out by the results. The thermal conductivity for the In doped $Pb_{0.5}Sn_{0.5}Te$ samples, in the temperature range 200 to 350° C., is <1.0 W/m-K. The value for conventionally synthesized materials is 1.5 W/m-K (see Gelbstein, Y.; Dashevsky, Z.; Dariel, M. P., In-doped Pb0.5Sn0.5Te p-type samples prepared by powder metallurgical processing for thermoelectric applications. *Physica B-Condensed Matter* 2007, 396, (1-2), 16-21).

Figure 15:
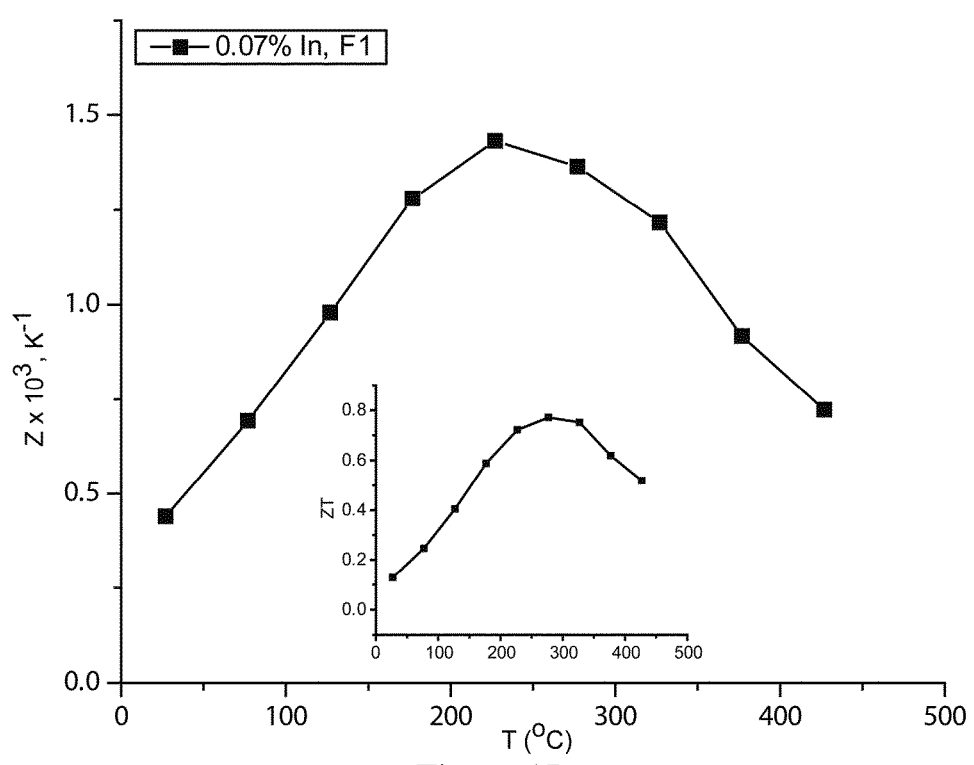
FIG. 15 shows the figure of merit for an embodiment.

FIG. 15 shows the figure of merit ($Z = S^2\sigma/\kappa$) for sample F1. The HPHT sintered material has approximately 2 times the figure of merit of conventionally sintered materials (see Gelbstein, Y.; Dashevsky, Z.; Dariel, M. P., In-doped Pb0.5Sn0.5Te p-type samples prepared by powder metallurgical processing for thermoelectric applications. *Physica B-Condensed Matter* 2007, 396, (1-2), 16-21) at its highest value and is consistently higher over the entire temperature range. These results show that enhanced figure of merit is achieved by improved Seebeck coefficient and lower thermal conductivity over conventionally sintered materials.

In summary, we have found that the precise HPHT sintering conditions are necessary to obtain a material that is kinetically stable for extended periods of time. Direct comparison to literature data of conventionally sintered thermoelectric materials shows that HPHT sintering is a viable method for achieving improvements in thermoelectric performance.

Equivalents

Although the invention has been described in connection with certain exemplary embodiments, it will be evident to those of ordinary skill in the art that many alternatives, modifications, and variations may be made to the disclosed invention in a manner consistent with the detailed description provided above. Also, it will be apparent to those of ordinary skill in the art that certain aspects of the various disclosed example embodiments could be used in combination with aspects of any of the other disclosed embodiments or their alternatives to produce additional, but not herein explicitly described, embodiments incorporating the claimed invention but more closely adapted for an intended use or performance requirements. Accordingly, it is intended that all such alternatives, modifications and variations that fall within the spirit of the invention are encompassed within the scope of the appended claims.

What is claimed is:

1. A method of increasing the ZT of a thermoelectric material, comprising:

exposing a thermoelectric material to elevated pressure and elevated temperature for a time sufficient to increase the ZT of the thermoelectric material, wherein the elevated pressure ranges from about 1 GPa to 20 GPa and the elevated temperature ranges from about 500° C. to about 2500° C.; and recovering the thermoelectric material with an increased ZT when measured at the pressure and temperature of use, wherein, when said consolidated blank of thermoelectric material is exposed to a temperature of use, an increased ZT is maintained for an extended period of time as evaluated at 10 days of exposure to the temperature of use, and wherein the thermoelectric material comprises GeTe—AgSbTe$_2$ alloys.

2. The method of claim 1, wherein the elevated pressure ranges from about 2 GPa to about 10 GPa.

3. The method of claim 1, wherein the elevated pressure ranges from about 3.5 GPa to about 4.5 GPa.

4. The method of claim 1, wherein the elevated pressure is about 4 GPa.

5. The method of claim 1, wherein the elevated temperature ranges from about a third of the melting temperature to about 500° C. above the melting point of the thermoelectric material at process pressures.

6. The method of claim 1, wherein the elevated temperature ranges from a sintering temperature of the thermoelectric material to about a melting point of the thermoelectric material at process pressures.

7. The method of claim 1, wherein the time sufficient to increase the ZT is from about 30 seconds to about 24 hours.

8. The method of claim 6, wherein the time sufficient to increase the ZT is from about 5minutes to about 30 minutes.

9. The method of claim 1, wherein the composition of the thermoelectric material further comprises dopants.

* * * * *